TRANSISTOR PULSE GENERATOR WITH INDUCTIVE MEANS

Filed June 5, 1961

INVENTOR.
ROGER N. BLUNT
BY Daniel R. Sharp
ATTORNEY

United States Patent Office 3,164,785
Patented Jan. 5, 1965

3,164,785

TRANSISTOR PULSE GENERATOR WITH INDUCTIVE MEANS

Roger N. Blunt, Rochester, N.Y., assignor to General Dynamics Corporation, Rochester, N.Y., a corporation of Delaware Filed June 5, 1961, Ser. No. 114,963
7 Claims. (Cl. 331—113)

This invention relates to a pulse generator and, more particularly, to a transistorized circuit of the free-running multivibrator type for generating short duration pulses.

It is frequently desirable to produce unidirectional pulses of small amplitude which may be of the order of 5 millivolts or less. Such pulses may be derived in devices of the prior art by attenuating pulses of relatively large magnitude generated by such devices. The use of an attenuator, however, may cause distortion of the small signals thus derived. The device according to the invention, on the contrary, does not require appreciable attenuation and, therefore, is not accompanied by the attendant wave-shape distortion.

Another advantage of the circuit, according to the invention, is that undesirable pulses of opposite polarity are never generated and, therefore, present no problem of elimination. This is in contrast to many types of test equipment wherein it is virtually impossible to eliminate entirely the undesirable pulses of opposite polarity which are present.

Another feature of the pulse generator, according to the invention, is that the shape of the pulses derived is independent of the operating frequency. This characteristic is not always obtainable in pulse generators of the prior art.

The pulse generator, in accordance with the invention, comprises a free-running multivibrator utilizing transistors which are switched on and off alternately in a manner well known to those skilled in the art of multivibrators. One of the characteristics of transistors is their finite switching time which prevents their following an input signal until a predetermined period after the signal has attained the cutoff level. An inductive element is connected in series with the output current path of each of the transistors. During the switching interval, both transistors will be conducting simultaneously and the current in the transistors will be changing rapidly. This rapid change in current through the inductive element will produce a comparatively large voltage pulse during each switching transient. The waveform of these pulses will be independent of the frequency of operation of the multivibrator and will depend essentially upon the switching characteristic of the transistors. In those instances where control of the amplitude is desirable, a variable resistor of small value may be placed in parallel with the inductive element to provide controlled attenuation of the pulse. This resistor further serves to absorb any transients which may be produced because of capacitance in the inductive element and its associated circuitry.

Other objects, features and advantages of this invention will become more apparent as the description progresses and upon the examination of the specification and drawings wherein.

Figure 1:
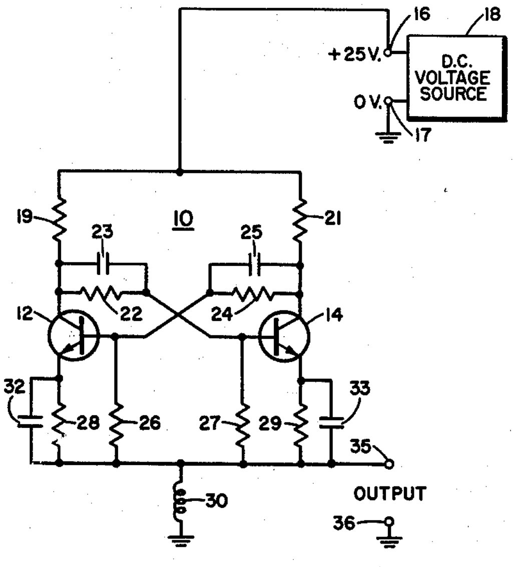
FIG. 1 illustrates a pulse generating circuit according to the invention.

Referring to the drawings, a free-running multivibrator is shown in FIG. 1 which is indicated generally by the reference numeral 10. This multivibrator includes a pair of semiconductor devices 12 and 14, each including a base electrode, an emitter electrode, and a collector electrode. The transistors 12 and 14 of FIG. 1 are shown, by way of example, as being of the N-P-N type. The collector electrode of transistor 12 is connected to the positive terminal 16 of a unidirectional voltage source 18 through resistor 19, whereas the collector electrode of transistor 14 is connected to the same positive terminal through a resistor 21. The base electrode of transistor 14 is cross-coupled to the collector electrode of transistor 12 by a resistor 22 and capacitor 23 in parallel. Similarly, the base electrode of transistor 12 and the collector electrode of transistor 14 are intercoupled by a resistor 24 in shunt with a capacitor 25. The bias for the base of transistor 12 is established by means of a voltage divider including resistors 24 and 26, while the base bias for transistor 14 is established by voltage divider resistors 22 and 27.

The emitter electrode of transmitter 12 is connected by way of a resistor 28 and an inductive element 30 to the negative terminal 17 of voltage source 18. This negative terminal may be at ground potential, as shown in FIG. 1. The emitter electrode of transistor 14 is connected to the same negative terminal 17 by way of a resistor 29 and the aforesaid inductive element 30. In other words, the inductive element 30 is disposed in the collector-emitter circuit of both transistors. The resistors 28 and 29 serve as stabilizing resistors to compensate for variations in direct current gain of the associated transistors which may occur with temperature or between units of a given type. Capacitors 32 and 33 are placed in shunt with respective resistors 28 and 29 to bypass the alternating current signals which occur during the switching.

The ungrounded end of coil 30 is connected to one output terminal 35; in the example shown, the other output terminal 36 is at ground potential. The output terminals may, in some cases, be connected across a portion of the coil 30, rather than across the ends of the coil.

Figure 2:
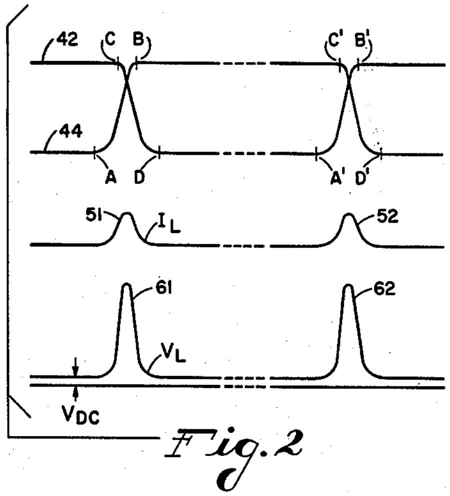
FIG. 2 illustrates waveforms explaining the operation of the circuit of FIG. 1.

If it be assumed that transistor 12 initially is conductive and transistor 14 nonconductive, collector current will, as shown by the curve 42 of FIG. 2, flow along a path including, in the order named, the negative terminal 17, coil 30, resistor 28, transistor 12, resistor 19 and then through the voltage source 18, back to the negative terminal 17. The current flowing through the coil 30 during this condition will be equal to the collector current in transistor 12.

Capacitor 23 discharges through resistors 22 and 27 while the collector current in transistor 12, as indicated by waveform 42 of FIG. 2, and the associated collector voltage, is constant.

As condenser 23 discharges, regenerative action occurs whereby less and less reverse bias is applied to transistor 14, until such time as forward bias is established in transistor 14; collector current then will start to flow in transistor 14 (see point A on waveform 44 of FIG. 2). Consequently, the voltage at the collector of transistor 14 will become more negative. This negative excursion is transferred by way of condenser 25 to the base of transistor 12, tending to cut off the flow of collector current in transistor 12. However, one of the inherent characteristics of transistors is that current flow in the collector circuit does not commence to fall until a finite time interval after cessation of base current. The time delay involved here is referred to commonly as the storage time. The total time delay involved between initiation of collector current flow in transistor 14 (point A on waveform 44 of FIG. 2) and the start of collector current decline in transistor 12 (point C on waveform 42 of FIG. 2) results, in part, from injected minority carriers being present in the base region of the transistor at the instant that input current is cut off. These carriers require a definite length of time to be collected. At a time corresponding to point D on waveform 42 of FIG. 2, the output current in transistor 12 attains its steady "off" value, while at a time corresponding to point B on waveform 44 of FIG. 2, the collector current in transistor 14 attains its steady "on" value.

It can be seen, therefore, that transistors 12 and 14 will be conducting simultaneously during a minor portion of the cycle indicated by the horizontal distance between points A and D in FIG. 2. Although the rise and fall times corresponding, respectively, to the horizontal distances between points C and D (or C′ and D′) and between A and B (or A′ and B′) have been shown equal in FIG. 2, it should be understood that these periods need not be of the same duration.

The total collector current in both transistors 12 and 14, and, hence, the current flowing through coil 30, is greater during the current transition period than the current normally present in coil 30. The increased current in coil 30 is represented by the current pulse 51 in waveform $I_L$ of coil current 30 shown in FIG. 2. Because of the changing current in coil 30, a voltage 61 is generated across coil 30 during current pulse 51. The waveform of the voltage across coil 30 is indicated in FIG. 2 as $V_L$.

The resistance inherent in coil 30 is quite small so that the direct current voltage level $V_{DC}$ at the output terminals generally is negligible. This bias voltage is shown somewhat exaggerated in FIG. 2.

Figure 3:
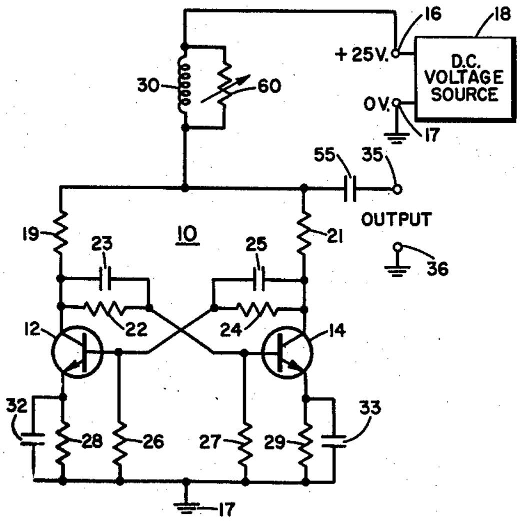
FIG. 3 is a modification of the pulse generator shown in FIG. 1.

Transistor 12 remains cut off and transistor 14 remains fully conducting until, after a period of time, corresponding to the horizontal distance between points D and A′ on waveform 42 of FIG. 2, capacitor 25 will have discharged through resistors 24 and 26 and forward bias will be established at the base of transistor 12. Transistor 12 will now conduct (see point A′ on waveform 42 of FIG. 2), and the collector voltage will fall. This negative-going transient is coupled by capacitor 23 to the base of transistor 14, thus establishing a reverse bias for transistor 14. The collector current of transistor 14 will start to fall (see point C′ on waveform 44 of FIG. 2), but not until an elapsed storage time after transistor 12 has been rendered conductive. The current in transistor 12 reaches its steady "on" value at a time corresponding to point B′ on waveform 42 of FIG. 2, while current in transistor 14 reaches its steady "off" value at a time corresponding to point D′ on waveform 44 of FIG. 2. The sum of the collector currents flowing in coil 30 will instantaneously increase during the current transition period and a second current pulse 52 is produced during this period. A corresponding output voltage pulse 62 appears across coil 30. The cycle heretofore described is repetitive. The pulses will occur at a repetition frequency which is twice that of the multivibrator. The pulse repetition rate will depend upon the factors which normally affect the frequency of operation of a free-running multivibrator. For example, the time constant of circuits 27, 23, and 26, 25 will influence the pulse repetition rate. It should be noted, however, that the amplitude of the output pulses is independent of the pulse repetition rate. In one application of the invention, pulses of the order of three volts were obtained across a coil 30 of 15 microhenries. It was found that this voltage level could be reduced to a value of approximately 0.3 volt by shunting the coil 30 of FIG. 1 with a resistance, such as shown in FIG. 3, having a value of 33 ohms. These values, however, are illustrative only and not limiting. The pulses are of positive polarity in the circuit illustrated in FIG. 1.

Figure 4:
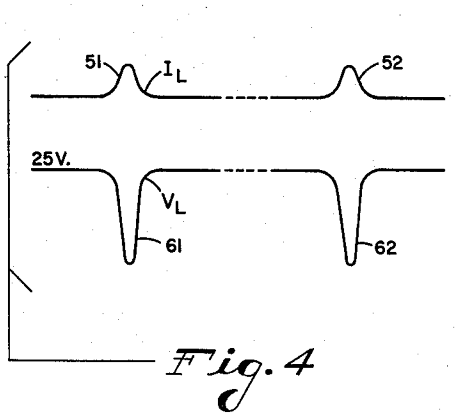
FIG. 4 represents output waveforms obtained from the circuit of FIG. 3.

In FIG. 3, a modification of the circuit of FIG. 1 is shown wherein the coil 30 is connected in series with the positive terminal 16 of the voltage supply 18. The current waveform $I_L$ of FIG. 4 is the same as that shown in FIG. 2. However, the output voltage pulses 61 and 62 at terminals 35 and 36 shown in the voltage waveform $V_L$ of FIG. 4 are now negative-going pulses which are superimposed upon a direct current level of 25 volts, that is, the voltage of the source 18. In this event, a blocking capacitor 55 should be inserted in series with the output leads to prevent passage of the direct current component.

In the circuit of FIG. 3, a variable resistor 60 of relatively small value is connected in parallel with coil 30. The purpose of this resistor is to attenuate the voltage pulse generated across coil 30 to some desired lesser value. The presence of the small resistor 60 across output terminals 35 and 36 produces a direct current voltage level, such as the voltage $V_{DC}$ previously referred to in FIG. 2; however, this can be taken care of easily by means of the blocking capacitor 55. Another function served by the resistor 60 is to damp out any possible ringing which might be caused by capacitance in the circuit associated with coil 30. It should be noted, in this connection, that an attenuating resistor could be used, if desired, in place of coil 30 of FIG. 1; in this event, the direct current voltage level $V_{DC}$ would be greater than that which would be produced with the coil 30 only; with the circuit of FIG. 1 thus modified, the direct current component may have to be blocked by an appropriate blocking capacitor in the output lead.

If P-N-P transistors were used instead of the N-P-N transistors in the circuit of FIG. 1, the voltage supply terminals would have to be reversely connected and pulses negative with respect to a reference voltage of +25 volts would be obtained, as shown in FIG. 4. In this case, a blocking capacitor normally would be required, for reasons already mentioned.

If the N-P-N transistors in the circuit of FIG. 3 were replaced by P-N-P transistors, terminals 16 and 17 would have to be reversed. Such a circuit would have the coil 30 in the negative, or ground, lead; output voltage pulses then would be produced which would be positive-going with respect to ground, just as shown in FIG. 2. In other words, changing the type of transistor will have the same effect as reversing the terminal to which the coil is connected.

What is claimed is:

1. A pulse generator comprising a free-running multivibrator having a pair of cross-coupled transistors, each transistor having an output circuit coupled to the input circuit of the other transistor by a shunt capacitive-resistive network, said networks constituting the sole feedback path for said transistors, each of said transistors having a current-carrying circuit a portion of which is common to both of said transistors, and an inductive element connected in said common portion of said current-carrying circuit across which output pulses may be derived.

2. A pulse generator comprising a free-running multivibrator having a pair of cross-coupled transistors, each transistor having an output circuit coupled to the input circuit of the other transistor by a shunt capacitive-resistive network, said networks constituting the sole feedback path for said transistors, each of said transistors having a current-carrying circuit a portion of which is common to both of said transistors, an inductive element connected in said common portion of said current-carrying circuit, and output terminal means connected across at least a portion of said inductive element.

3. A pulse generator comprising a free-running multivibrator having a pair of cross-coupled electron devices, each electron device having an output circuit coupled to the input circuit by a shunt capacitive-resistive network, said networks constituting the sole feedback path for said electron devices, each of said devices having a current-carrying circuit a portion of which is common to both of said devices, said devices being characterized by a finite switching interval during which the current flowing in each device is changing from one steady level to another, and inductive means disposed in said common portion for deriving output voltage pulses during said finite switching interval.

4. A pulse generator comprising a free-running multivibrator having a pair of cross-coupled transistors, each transistor having an output circuit coupled to the input circuit of the other transistor by a shunt capacitive-resistive network, said networks constituting the sole feedback path for said transistors, each of said transistors conducting to the exclusion of the other during a major portion of the operating cycle, both of said transistors conducting simultaneously during a minor portion of the operating cycle, an inductive element connected in circuit with both of said transistors, and output terminal means connected across at least a portion of said inductive element for deriving output pulses when said transistors are simultaneously conducting.

5. A pulse generator comprising a free-running multivibrator having a pair of cross-coupled transistors, each transistor having an output circuit coupled to the input circuit of the other transistor by a shunt capacitive-resistive network, said networks constituting the sole feedback path for said transistors, each of said transistors having a current-carrying circuit a portion of which is common to both of said transistors, said transistors being characterized by a finite switching interval during which the current flowing in each transistor is changing from one steady level to another, an inductive element connected in said common portion of said current-carrying circuit, and output terminal means connected across at least a portion of said inductive element at which output pulses may be derived during said finite switching interval.

6. A pulse generator comprising a free-running multivibrator having a pair of cross-coupled transistors, each transistor having an output circuit coupled to the input circuit of the other transistor by a shunt capacitive-resistive network, said networks constituting the sole feedback path for said transistors, a power supply for said multivibrator having positive and negative terminals, each of said transistors having a current-carrying circuit a portion of which is common to both of said transistors, said transistors being characterized by a finite switching interval during which the current flowing in each transistor is changing from one steady level to another, an inductive element connected in said common portion of said current-carrying circuit and having one end thereof connected to said positive terminal, and output terminal means connected across at least a portion of said inductive element at which output pulses may be derived during said finite switching interval.

7. A pulse generator comprising a free-running multivibrator having a pair of cross-coupled transistors, each transistor having an output circuit coupled to the input circuit of the other transistor by a shunt capacitive-resistive network, said networks constituting the sole feedback path for said transistors, a power supply for said multivibrator having positive and negative terminals, each of said transistors having a current-carrying circuit a portion of which is common to both of said transistors, said transistors being characterized by a finite switching interval during which the current flowing in each transistor is changing from one steady level to another, an inductive element connected in said common portion of said current-carrying circuit and having one end thereof connected to said negative terminal, and output terminal means connected across at least a portion of said inductive element at which output pulses may be derived during said finite switching interval.

References Cited in the file of this patent

UNITED STATES PATENTS

| | | |
|---|---|---|
| 2,812,437 | Sziklai | Nov. 5, 1957 |
| 2,956,241 | Huang | Oct. 11, 1960 |
| 3,034,070 | Wood | May 8, 1962 |